US 6,519,609 B1

(12) United States Patent
Touzet

(10) Patent No.: US 6,519,609 B1
(45) Date of Patent: Feb. 11, 2003

(54) METHOD AND SYSTEM FOR MATCHING BOOLEAN SIGNATURES

(75) Inventor: Olivier Touzet, Speracedes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/205,916

(22) Filed: Dec. 4, 1998

(51) Int. Cl.[7] .......................... G06F 17/00; G06F 17/50
(52) U.S. Cl. ........................ 707/104.1; 707/102; 716/1
(58) Field of Search ................................ 707/104, 100, 707/101, 102, 104.1; 703/1; 716/1, 2, 7, 17, 18

(56) References Cited

U.S. PATENT DOCUMENTS

| 5,237,513 A | * | 8/1993 | Kaplan .................. 395/500.03 |
| 5,311,442 A | * | 5/1994 | Fukushima ................. 364/488 |
| 5,416,719 A | * | 5/1995 | Pribetich .................... 364/489 |
| 5,469,367 A | * | 11/1995 | Puri et al. ................... 364/489 |
| 5,521,835 A | * | 5/1996 | Trimberger ................. 364/489 |
| 6,023,566 A | * | 2/2000 | Belkhale et al. ........ 395/500.03 |

OTHER PUBLICATIONS

Christine M. Gerveshi "Comparisons of CMOS PLA and Polycell representations of control logic", IEEE 1986, pp. 638–642.*
Uwe Hinsberger et al "Boolean matching for large libraries", DAC Jun. 15–19, 1998, pp. 206–211.*
Hans–Jorg Mathony et al "CARLOS: an automated multi-level logic design system for CMOS semi–custom integrated circuits", IEEE 1988, pp. 346–355.*
Takayuki Suyama et al "LUT–based FPGA technology mapping using permissible functions", IEEE 1995, pp. 215–218.*
Giovanni De Micheli "Technology mapping of digital circuits", IEEE 1991, pp. 580–586.*
Keutzer, Kurt, "DAGON: Technology Binding and Local Optimization by DAG Matching"; 24th *ACM/IEEE Design Automation Conference, Proceedings* 1987; pp. 341–347.
Detjens, Ewald et al., "Technology Mapping in MIS", *IEEE International Conference On Computer–Aided Design*, ICCAD–87, Nov. 9–12, 1987; pp. 116–119.
Mailhot, Frederic et al., "Technology Mapping Using Boolean Matching and Don't Care Sets", *EDAC The Proceedings of The European Design Automation Conference*, Mar. 12–15, 1990; pp. 212–216.

* cited by examiner

Primary Examiner—Safet Metjahic
Assistant Examiner—Uyen Le
(74) *Attorney, Agent, or Firm*—Bingham McCutchen LLP

(57) ABSTRACT

A method and system for matching a node of a combinatorial block with a library cell in a technology library using truth tables. A truth table representing the function of the node of the combinatorial block is generated. Similarly, a truth table representing the function of the library cell is generated. If the truth tables match, then the node of the combinatorial block can be tiled with the library cell. The two truth tables may match if the tables have the same number of inputs and the same signature. Also, the truth tables may match if the inputs to one truth table are permuted and/or inverted, or if the output of the truth table is inverted. These variations of the truth tables are compared to determine if the truth tables match.

19 Claims, 3 Drawing Sheets

METHOD AND SYSTEM FOR MATCHING BOOLEAN SIGNATURES

BACKGROUND

1. Field of the Invention

This invention pertains generally to digital circuit design and particularly to logic synthesis and more particularly to a technology mapper used to perform logic synthesis.

2. Background of the Invention

Modem logic circuits are so complex that circuit designers must use computer-based techniques to help them in their task. The designers first abstractly represent the circuit as multiple combinatorial blocks (e.g., single-output, multiple-input Boolean equations) separated by sequential states. The combinatorial blocks are described by Directed Acyclic Graphs ("DAGs") also referred to as "Boolean Trees." In general, the computer-based techniques transform the abstract representation of the circuit design into a technology-dependent netlist representing the same circuit design. Computer-based techniques including behavioral synthesis, floorplanning, and logic synthesis are used to perform this transformation.

Logic synthesis takes the abstract representation of the circuit design, performs some abstract optimizations on the combinatorial and sequential blocks, and maps the blocks to the target technology library. Logic synthesis uses a technique called "Technology Mapping" to map the combinatorial blocks of the Boolean tree into the target library by replacing the nodes with library cells.

The Technology Mapper, accordingly, should efficiently tile a DAG with library cells. Usually, the task of matching the Boolean equation of a sub-part of the DAG to a cell is passed off to another entity, called the "Boolean Matcher." The Boolean Matcher accepts a father node, some child nodes, and a library cell, and determines if the cell can cover the group of nodes. That is, the Boolean Matcher determines whether the cell has the same equation as a sub-part of the DAG, or the inverted equation modulo the inversion of any input. If the cell has the same equation as a sub-part of the DAG, the Boolean Matcher produces the input correspondence, which associates each cell input to an input of a node and states the cell's input's polarity.

The difficulty in performing Boolean matching lies in the possible permutation of inputs. A Boolean Matcher must be able to find not only an equivalent cell, but also the input correspondence. Thus, the representation of the equations for the DAG and the cell must conveniently allow inputs of at least one equation to be swapped in order to test the equivalence for any given pin permutation.

To this end, many techniques have been developed for performing Boolean matching. Some techniques perform matching based on tree patterns. Before starting a mapping process, the library cells are parsed and patterns are stored which represent the function implemented by each cell. Then, the Matcher essentially matches the current sub-tree function with a pattern. To allow the mapper to find better solutions, the matcher tests the equivalence of the cell pattern and the sub-tree function modulo the inversion of the function inputs and modulo the inversion of the function.

One reference,. Kurt Keutzer, "DAGON: Technology Binding and Local Optimization by DAG Matching," Proceedings of the 24th ACM/IEEE Design Automation Conference, 1987, introduces a formalism for technology mapping using DAGs. The matching is performed by matching technology patterns in the canonical NAND/NOT form, thereby allowing matching modulo the polarity of inputs. However, this technique requires the Boolean network to be prepared before matching by covering it with virtual NAND/NOT cells. In addition, one has to write the patterns of the library cells in NAND/NOT form in order to map onto a technology library.

Another technique, described in E. Detjens, G. Gannot, R. Rudell, A. Sangiovanni-Vincentelli, A. Wang, "Technology Mapping in MIS," Proceedings of the ICCAD, 1987, also uses Boolean matching. This technique creates all non-isomorphic and irredundant NAND/NOT-based graphs. For each graph, an automaton is generated that does a depth-first transversal of the graph. The Boolean network is transformed into NAND/NOT graphs, and the match is tested by the automaton trying to transverse the Boolean network graph. A problem with this technique is that it must try several matches on the same cell. For instance, on an AND4 cell, two automata are used, one for the balanced graph and one for the unbalanced graph.

In F. Mailhot, G. De Michelli, "Technology Mapping using Boolean Matching," Proceedings of the European Conference on Design Automation, 1990, the authors focus on symmetry between inputs to rapidly eliminate non-matching cases. For instance, when matching an AND2 (s=a AND b) gate, the two inputs can be marked as symmetric. Thus, if a Boolean equation $F(x, y)$ is matched with $\{x=a, y=b\}$ with a certain polarity for x and y, $F(x, y)$ is also matched with $\{x=b, y=a\}$ with the same polarities. On the contrary, it is useless to test the matching with $\{x=b, y=a\}$ if the matching $\{x=a, y=b\}$ has already been checked and found not feasible. This technique greatly limits the search space for symmetric cells (and library cells are often symmetric). But for all possible permutation of inputs, the technique must re-do the Shannon decomposition following the input permutation ordering.

Accordingly, there is a need for a technology mapper that does not have the deficiencies of the above-described techniques.

SUMMARY OF THE INVENTION

The above needs are met by a method and system for technology mapping that compares signatures of truth tables to determine whether part of a combinatorial block matches a technology cell. A preferred embodiment of the present invention accepts a Boolean tree describing the function of all or part of the combinatorial block and a cell of a technology library in the form of a string describing the function of the cell. The string is parsed to generate a Boolean tree describing the function of the library cell.

First and second truth tables are respectively generated from the Boolean tree representing the portion of the combinatorial block and the Boolean tree describing the function of the cell. Each truth table includes one or more inputs representing the one or more inputs to the nodes of the Boolean tree from which the truth table was generated. In addition, each truth table includes a signature describing the output of the Boolean tree from which the truth table was generated. Due to the nature of truth tables, a truth table representing the function of a combinatorial block or library cell can be described as a pair $\{I, S\}$, where I is an ordered list of the inputs and S is a signature such as an integer representing the output column of the truth table in decimal notation.

If the first and second truth tables match, then the portion of the combinatorial lock and the library cell described by the first and second truth tables also match. Two truth tables may match if the truth tables have the same number of inputs. Therefore, a referred embodiment of the present invention compares the two ordered lists of inputs to determine whether each list includes the same number of inputs. In addition, two truth tables having the same number of inputs match if the signatures of the truth tables also match. Accordingly, if each truth table has the same number of inputs, the signatures of the two truth tables are compared to determine whether the truth tables match, i.e., represent the same function.

If the signatures of the truth tables do not match, then it is possible that the signatures will match if the order of the inputs to the first or second truth tables is permuted. When generating the truth table representing the library cell, therefore, a preferred embodiment of the present invention also generates truth tables representing the cells having permutations of the inputs of the library cell. While there may be a large number of permutations, many cells have symmetric pins, which reduces the number of unique permutations. The truth table representing the portion of the combinatorial block is compared against all of the truth tables representing permutations of the inputs of the library cell to determine whether the signatures match.

In addition, the signatures of the truth tables may match if the output column of one of the truth tables is inverted. This inversion is represented by performing a logic NOT on the first $2^n$ bits of the value S representing the signature of the truth table. Preferably, the present invention determines whether the inversion of a signature matches each time it determines whether the signatures of two truth tables match.

Moreover, the signatures of the truth tables may match if one or more of the inputs to one of the truth tables is inverted. Accordingly, a preferred embodiment of the present invention also determines whether the signature resulting from the inversion of one or more inputs of a truth table matches the signature of the other truth table.

Of course, the present invention preferably considers all unique permutations and inversions of inputs to a truth table when determining whether the signatures, or an inversion of one of the signatures, of the truth tables match. If the truth tables match, the matching portion of the combinatorial block can be tiled with the matching library cell and a cell or cells for performing any necessary inversions to the inputs or output.

A preferred embodiment of the present invention includes an interface to software modules for accepting a reference to a node of a Boolean tree of the combinatorial block. In addition, the software interface accepts the ordered list of the input pins to the Boolean tree. The software interface also preferably accepts a reference to the string describing the cell from the technology library.

Preferably, software modules generate the truth tables from the accepted node and string as described above. The software modules then compare the truth tables as described above and return an output indicating whether the tree can be tiled with the library cell. If the tree can be tiled with the library cell, the modules also return an ordered list of the inputs to the tree, a corresponding ordered list of inputs to the library cell also indicating whether any of the inputs are inverted, and a value indicating whether the library cell matches the Boolean tree or the inverted tree. In an alternative embodiment, the software modules do not accept a reference to the string describing the cell from the technology library. Instead, the software modules search for a matching signature from among all of the library cells.

DETAILED DESCRIPTION OF THE PREFERRED EMBODIMENTS

Figure 1:
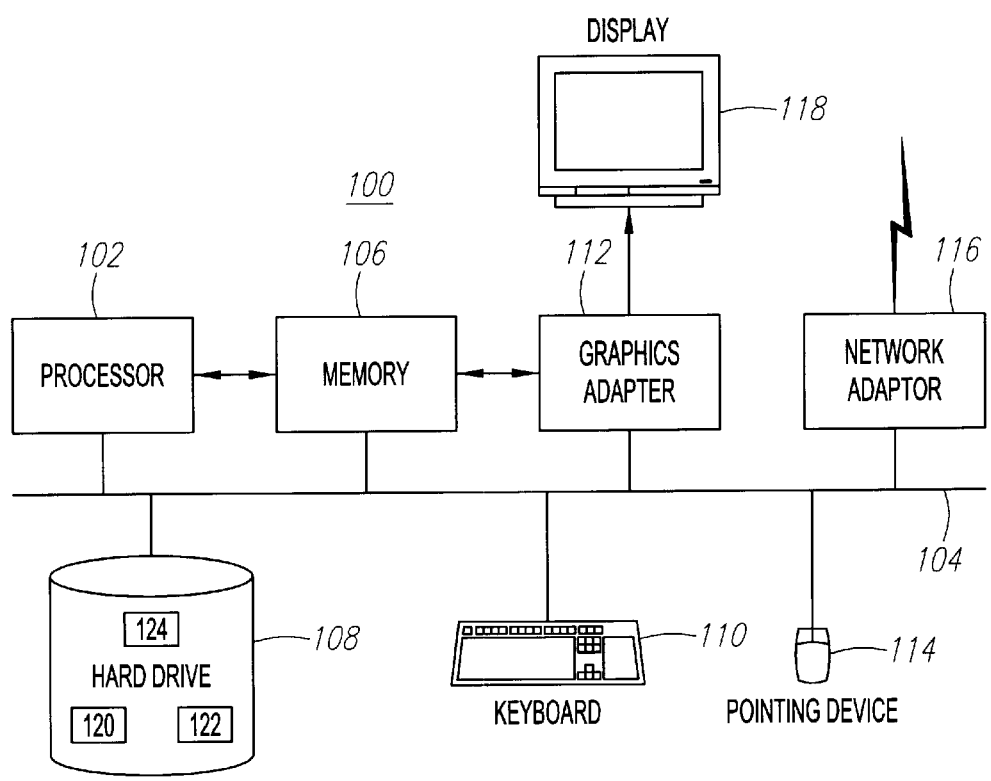
FIG. 1 is a high-level block diagram of a computer system for performing Boolean matching according to one embodiment of the present invention.

The present invention is a Boolean Matcher based on truth tables. During the technology mapping phase of the logic synthesis of an electronic circuit, a combinatorial block of the circuit design is input to a Technology Mapper. The combinatorial block is a Boolean network (also referred to as a "Boolean tree") having a single output and multiple inputs and represented by a Directed Acyclic Graph ("DAG") of simple Boolean operations such as AND, OR, NAND, and NOT. The Technology Mapper looks for cells in a technology library that match the Boolean operations of the combinatorial block. Matching cells are substituted for, or tiled over, the corresponding Boolean operations in the Boolean tree, and, once all of the Boolean operations are mapped to technology cells, the resulting output is a technology-dependent netlist of cells.

The present invention pertains to a method and system for matching the Boolean operations in the combinatorial block with a cell or cells in the technology library. Several definitions are necessary to describe the present invention. A "Technology Library" is a technology-specific list of cells for performing logical operations. A "library cell" or "cell" refers to a combinatorial gate preferably having only one output. The word "integer" preferably refers to a 32-bit value. A "truth table" or "TT" is a table illustrating the output of a Boolean equation for a given set of inputs. In this description, a TT representing the function of a combinatorial block is referred to as a "circuit TT." A TT representing the function of a library cell is referred to as a "library TT" or a "cell TT." A "Boolean tree" or "Boolean network" is a single-output, multiple-input DAG having simple Boolean operators (e.g., AND, OR, NAND, and NOT) and is used to represent a Boolean function of a combinatorial block of the circuit design or a library cell. A Boolean tree has one or more nodes, and each node forms a sub-tree of the larger Boolean tree. In this description the term "Boolean tree" often refers to a smaller sub-tree depending from a node in a larger Boolean tree. Likewise, the term "combinatorial block" may refer to a sub-part of a larger combinatorial block.

The present invention represents a combinatorial block as a TT. The preferred embodiment of a TT lists the inputs of the combinatorial block in order of appearance in the equation representing the combinatorial block from right to left. Thus, the equation Z=A AND (NOT B) is represented by the TT of Table 1.

TABLE 1

| B | A | Z |
|---|---|---|
| 0 | 0 | 0 |
| 0 | 1 | 1 |
| 1 | 0 | 0 |
| 1 | 1 | 0 |

Since the values of the inputs on each row are known, i.e., on row 0: B=0 and A=0, on row 1: B=0, A=1, etc., this TT can be represented as a pair {(B, A), 2}, with (B, A) being the ordered list of inputs and "2" being the representation of the output column in decimal notation. For example, reading from bottom to top, Z is binary 0010, which is 2 in decimal notation. The example of Table 1 can be generalized as: Any function of a combinatorial block is equivalent to a pair {I, S}, where I is an ordered list of the inputs and S is a signature such as an integer representing the output column in decimal notation.

The width of the signature of an n-input, or n-pin, cell is 2n bits because an n-input TT has $2^n$ rows. For a 5-pin cell, the signature requires $2^5$=32 bits. Many computer programming environments represent an integer with 32 bits. For a 6-pin cell, the signature requires $2^6$=2 integers. For a 7-pin cell, the signature requires $2^7$=4 integers. Since representing cells having more than five pins is computationally expensive, a preferred embodiment of the present invention limits the size of the signature to one integer, which means that it can handle all combinatorial cells having 5 or fewer inputs.

However, the present invention can easily handle cells having more than 5 inputs, provided that the computing power is available. In addition, it is possible to represent the signature using data types of different or varying lengths. For example, in one embodiment the signature is represented with one or more long (e.g., 64-bit) integers while in another embodiment the signature is represented by a varying length vector of bits.

FIG. 1 is a high-level block diagram of a computer system 100 for performing Boolean matching according to one embodiment of the present invention. Illustrated are at least one processor 102 coupled to a bus 104. Also coupled to the bus 104 are a memory 106, a storage device 108, a keyboard 110, a graphics adapter 112, a pointing device 114, and a network adapter 116. A display 118 is coupled to the graphics adapter 112.

The at least one processor 102 may be any general-purpose processor such as an INTEL x86 compatible or SUN MICROSYSTEMS SPARC compatible central processing unit (CPU). The storage device 108 may be any device capable of holding large amounts of data, like a hard drive, compact disk read-only memory (CD-ROM), DVD, or some form of removable storage device. The memory 106 holds instructions and data used by the processor 102. The pointing device 114 may be a mouse, track ball, light pen, touch-sensitive display, or other type of pointing device and is used in combination with the keyboard 110 to input data into the computer system 100. The graphics adapter 112 displays images and other information on the display 118. The network adapter 116 couples the computer system 100 to a local or wide area network not shown).

Program Modules 120 for performing Boolean matching, also referred to as the "Matcher"120, according to one embodiment of the present invention are preferably stored on the storage device 108, loaded into the memory 106, and executed by the processor 102. In addition, an abstract representation of a circuit design 122 and a technology cell library 124 are preferably stored in the storage device 108 and loaded into the memory 106. Alternatively, hardware or software modules may be stored elsewhere within the computer system 100 for performing Boolean matching as described herein.

Preferably, the abstract representation of the circuit design 122 is a combinatorial block. The Boolean function of the combinatorial block is presented to the Matcher 120 in the form of a Boolean tree. Library cells, in contrast, are commonly represented as a string describing the function of the cell. For example, the string "AND2B1" may describe the library cell correspond to the equation "Z=A AND (NOT B)." When a TT is constructed from a library cell, the string equation is parsed and then used to generate a Boolean tree which is presented to the Matcher 120. The Matcher 120 preferably makes TTs from the presented Boolean trees by performing depth-first traversals of the trees.

Figure 2:
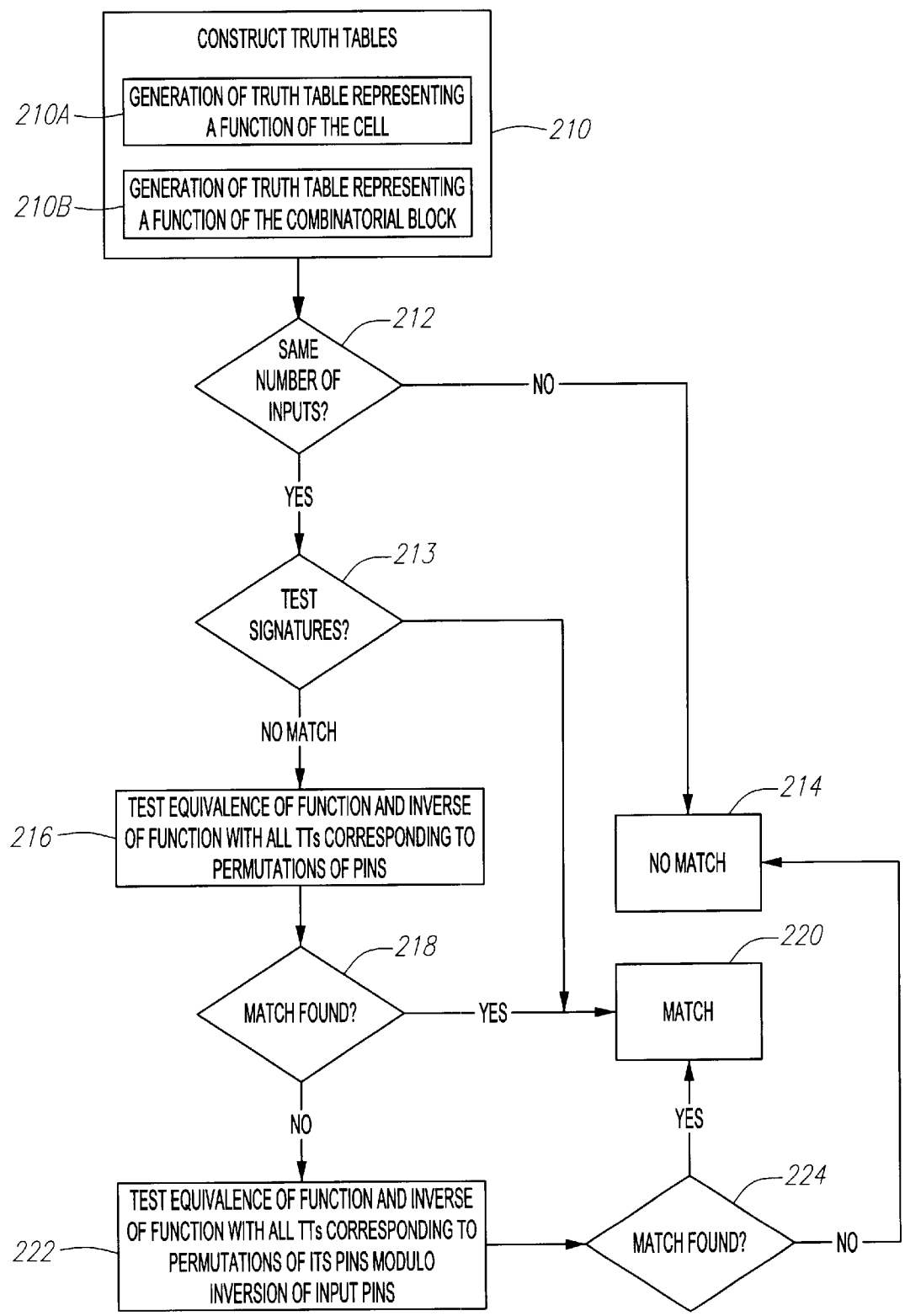
FIG. 2 is a flow chart illustrating the steps for performing Boolean matching according to an embodiment of the invention.

FIG. 2 is a flow chart illustrating the steps for performing Boolean matching according to an embodiment of the invention. Initially, TTs are constructed 210 for one or more cells in the technology library 124 ("the cell TT") and a TT is constructed 210 from the abstract representation of a circuit design 122 ("the circuit TT"). The TTs are generated such that the cell TTs represent a function of the cell 210A and the circuit TTs represent a function of the combinatorial block 210B. Next, the cell TT and the circuit TT are compared to determine if they have the same number of inputs 212. If the number of inputs is not the same, then the cell TT and the circuit TT do not match 214. If the number of inputs is the same, then the cell TT and the circuit TT are compared to determine if their signatures match 213. If the signatures match, then the cell TT and the circuit TT match 220. If the signatures do not match, then the equivalence of the function and inverse of the function with all TTS corresponding to permutations of pins are tested 216. If the test of step 216 yields a match, then the cell TT and the circuit TT match 220. If the test of step 216 does not yield a match, then the equivalence of function and inverse of the function with all TTs corresponding to permutations of its pins modulo inversion of input pins are tested 222. If the test of step 222 yields a match, then the cell TT and the circuit TT match 220. If the test of step 222 does not yield a match, then the cell TT the circuit TT do not match 214.

Figure 3:
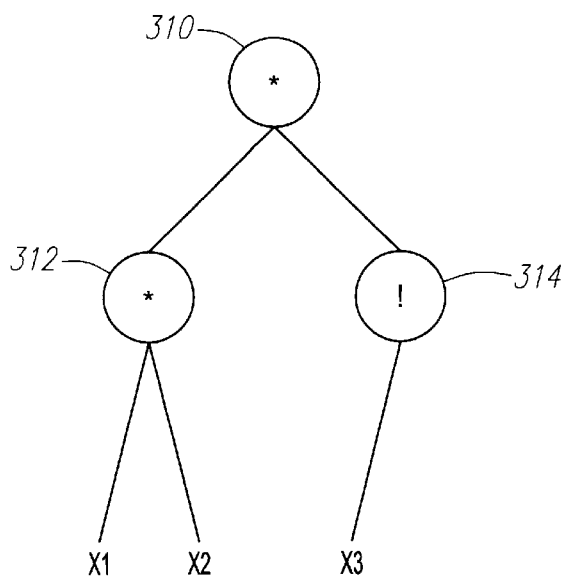
FIG. 3 illustrates a Boolean tree generated by parsing the equation Z=((X1 AND X2) AND (NOT X3))

For example, FIG. 3 illustrates a Boolean tree generated by parsing the equation "Z=((X1 AND X2) AND (NOT X3))." The tree has three nodes 310, 312, 314 each representing a Boolean function performed on the nodes' inputs. For example, node 312 performs an AND function on inputs X1 and X2 while node 314 performs a NOT function on input X3. The results of the operations performed by nodes 312 and 314 are ANDed by node 310.

To build an equivalent TT from the Boolean tree 300 of FIG. 3, a recursive procedure is preferably applied to the tree 300. The recursive procedure builds TTs for each of the child nodes (i.e., nodes 312 and 314) before building the TT for the entire tree 300.

The following pseudocode illustrates one embodiment of the recursive procedure according to the present invention:

```
TT* make TT(node) {
    switch(node->op) {
        case NO_OP:
            return new TT(2, node ->name); // 2 is the buffer signature
        case NOT_OP:
```

```
        tt=makeTT(node->left);
        return tt->inv();      // invert the signature
    case DUAL_OP:
        left=makeTT(node->left);
        right=makeTT(node->right);
        if(node->op == AND_OP) {
            return right->and(left);
        } else if (node->op == OR_OP) {
            return right->or(left);
        } else if (node->op == XOR_OP) {
            return right->xor(left);
        }
    }
}
```

The above pseudocode creates the following TTs from the Boolean tree 300:

TABLE 2

| | Left = | |
|---|---|---|
| X1 | X2 | AND0 |
| 0 | 0 | 0 |
| 0 | 1 | 0 |
| 1 | 0 | 0 |
| 1 | 1 | 1 |

TABLE 3

| Right = | |
|---|---|
| X3 | NOT0 |
| 0 | 1 |
| 1 | 0 |

The following pseudocode illustrates how one embodiment of the present invention ANDs two TTs, TT1 and TT2:

```
for (int row=0; row<2^(nb1+nb2); row++) {
    row1 = row >> nb2;
    row2 = row & (2^nb2 - 1);
    if((sig1 & 2^row1) && (sig2 & 2^row2))
        {NewSig |=2^row;}
}
```

In the pseudocode, sig1 and nb1 are respectively the signature and the number of inputs of TT1 and sig2 and nb2 are respectively the signature and number of inputs of TT2. NewSig is the resulting signature. As is known to those familiar with the C programming language, ">>" is a bitwise right shift operator, "&" is a bitwise AND operator, and "|" is a bitwise OR operator. When applied to the TTs of Tables 2–3, sig1=8, nb1=2, sig2=1, nb2=1, and NewSig=64. Table 4 shows the TT resulting when the TTs of FIGS. 2 and 3 are ANDed as described above.

TABLE 4

| Result of Left AND right: | | | |
|---|---|---|---|
| X1 | X2 | X3 | AND0 |
| 0 | 0 | 0 | 0 |
| 0 | 0 | 1 | 0 |

TABLE 4-continued

| Result of Left AND right: | | | |
|---|---|---|---|
| X1 | X2 | X3 | AND0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 1 |
| 1 | 1 | 1 | 0 |

If the two TTs being ANDed together have duplicate pins, then the resulting TT is constructed differently. The following pseudocode illustrates how a preferred embodiment of the present invention ANDs together two TTs, TTA and TTB, having duplicate pins into a third table, TTC.

```
for (int row=0; row<2^(nb1+nb2-nbDuplicates); row++) {
    row1=0;
    for(int pin=0; pin<nb1; pin++) {
        if(row & 2^index(pin)) {row1 |= 2^pin;}
    }
    row2 = row & (2^nb2 - 1);
    if((sig1 & 2^row1) && (sig2 & 2^row2))
        {NewSig |=2^row;}
}
```

The above pseudocode uses a pin table, "index", of width nb1 that retains the location of each pin of the first TT in the resulting TT. The pseudocode operates on the pins of the TTs, where TTA=($A_{n-1}$, $A_{n-2}$, ..., $A_0$) and TTB=($B_{m-1}$, $B_{m-2}$, ..., $B_0$). In the TTC, the pins are ordered from right to left with TTB's pins first, then with the remaining unique pins of TTA. If there are no duplicate pins in TTA and TTB, TTC=($A_{n-1}$, ..., $A_0$, $B_{m-1}$, ..., $B_0$). If the two tables have a duplicate pin (i.e., $A_{n-1}=B_{m-j}$), then TTC=..., $A_{n-1}$, ..., $A_{n-i+1}$, $A_{n-i-1}$, ..., $A_0$, $B_{m-1}$, $B_{m-2}$, ..., $B_0$).

For example, if TTA contains the ordered inputs (D, A, E) and TTB contains the ordered inputs (A, B, C), then TTC has the ordered inputs (D, E, A, B, C). The pin table contains {4, 2, 3}, indicating that pin D is the fourth element of TTC (the rightmost element of TTC is at index zero), pin A is the second element of TTC, and pin E is the third element of TTC. Note that the ordering of the pins in TTC is arbitrary, and an alternative embodiment of the present invention can use a different order.

The following pseudocode illustrates how one embodiment of the present invention ORs two TTs, TT1 and TT2:

```
for(int row=0; row<2^(nb1+nb2); row++) {
    row1 = row >> nb2;
    row2 = row & (2^nb2 - 1);
    if((sig1 & 2^row1) || (sig2 & 2^row2))
        {newSig |= 2^row;}
}
```

When the two TTs being OR'd have duplicate pins, the "if" statement in the pseudocode remains the same but row1 is calculated as in the pseudocode for ANDing with duplicate pins and the initial "FOR" loop is extended to account for all unique pins.

The following pseudocode illustrates how one embodiment of the present invention XORs two TTs, tt1 and tt2. Note that sig1 OR sig2 is equivalent to (sig1 AND (NOT sig2)) OR ((NOT sig1) AND sig2).

```
for(int row=0; row<2(nb1+nb2); row++) {
    row1 = row >> nb2;
    row2 = row & (2nb2 - 1);
    if(((sig1 & 2row1 ) || (!(sig2 & 2row2)))
    ||((!(sig1 & 2row1 )) || (sig2 & 2row2)))
        {newSig |= 2row;}
}
```

When the two TTs being XOR'd have duplicate pins, the "if" statement in the pseudocode remains the same but row1 is calculated as in the pseudocode for ANDing with duplicate pins and the initial "FOR" loop is extended to account for all unique pins.

Performing a NOT operation on a TT is trivial, since it only requires a logical inversion on the signature.

While it may initially appear that the resulting TTs will be extremely large for large Boolean functions, in fact each TT can be represented using the simple pair {I, S} described above. Accordingly, Table 2 can be represented as {(X1, X2), 8}, Table 3 can be represented as {(X3), 1} and Table 4 can be represented as {(X1, X2, X3), 64}.

For reasons explained below, the Matcher 120 also preferably generates and stores a TT for each permutation of the library cell's pins. For an n-pin TT, there are !n (n-factorial) permutations. Thus, there are 120 permutations for a 5-pin TT. However, in practice many of the library cells have symmetric pins, which reduces the number of unique permutations. For example, the cell AND3 requires only 1 signature and 1 pin permutation: {(A1, A2, A3), 128}. The cell AO1221 (S=NOT ((A1 AND A2) OR (B1 AND B2) OR C)), in contrast, requires 15 pin permutations.

After the TTs have been constructed 210, the circuit TT (The TT generated from a combinatorial block of the abstract representation of the circuit 122) is compared with the cell TTs (The TTs generated from one or more library cells). This comparison determines whether the circuit TT is equivalent to a cell TT. If the TTs are equivalent, then the combinatorial block in the circuit design 122 can be tiled with the cell from the technology library 124.

As part of the TT comparison, the number of inputs to each TT is compared 212. Two TTs can match only if they have the same number of inputs. In order for the circuit TT and the cell TT to represent the same function, therefore, the TTs must have the same number of inputs.

Next, the circuit TT is tested against the cell TTs having the same number of inputs to determine 213 whether the TTs have the same signature. If two TTs have the same signature, the TTs represent the same function. Since only one integer is used to hold the number of inputs to a TT and another integer is used to represent the signature of the TT, determining 212, 213 whether two TTs have the same number of inputs and same signatures can be performed with only two integer comparisons.

If a cell TT having the same signature is not found, it is possible that the circuit TT matches a cell TT if the order of the inputs to the cell TT (or circuit TT) are permuted 216. For example, suppose that the combinational block having the equation "Y=(NOT X1) AND X2" is being matched against the library cell AND2B1 having the equation "Z=A AND (NOT B)." The following TT is built to represent the function of the combinational block:

TABLE 5

| X2 | X1 | Y |
|---|---|---|
| 0 | 0 | 0 |
| 0 | 1 | 0 |
| 1 | 0 | 1 |
| 1 | 1 | 0 |

Table 5 can be represented by the string {(X1, X2), 4}. The following TT is built to represent the function of the library cell:

TABLE 6

| B | A | Y |
|---|---|---|
| 0 | 0 | 0 |
| 0 | 1 | 1 |
| 1 | 0 | 0 |
| 1 | 1 | 0 |

Table 6 can be represented by the string {(A, B), 2}.

It is apparent from studying the above two TTs that the tables can be matched if the input columns of the cell's TT are swapped. Swapping columns B and A in Table 6 yields the following table:

TABLE 7

| A | B | Y |
|---|---|---|
| 0 | 0 | 0 |
| 0 | 1 | 0 |
| 1 | 0 | 1 |
| 1 | 1 | 0 |

Table 7 can be represented by the string {(A, B), 4}, which is obviously mappable with {(X1, X2), 4} with the pin correspondence (X1→A) and (X2→B). For this reason, the circuit TT is preferably compared with each TT representing permutation of the inputs of the cell to determine whether the signatures match.

While checking whether the circuit TT matches a cell TT, it is also necessary to determine 216 whether the inverted function of the circuit TT matches a cell TT or a TT representing a permutation of the cell's inputs. Given a TT $\{(i_{n-1}, \ldots i_0), S\}$, the inverted TT is $\{(i_{n-1}, \ldots, i0), \sim S\}$, with ~being the logic NOT on the $2^n$ first bits of S. For instance, consider the TT representing the function of the AND2 cell:

TABLE 8

| X2 | X1 | Y |
|---|---|---|
| 0 | 0 | 0 |
| 0 | 1 | 0 |
| 1 | 0 | 0 |
| 1 | 1 | 1 |

In addition, consider the TT representing the function of the NAND2 cell:

TABLE 9

| X2 | X1 | Y |
|---|---|---|
| 0 | 0 | 1 |
| 0 | 1 | 1 |

TABLE 9-continued

| X2 | X1 | Y |
|----|----|---|
| 1  | 0  | 1 |
| 1  | 1  | 0 |

To determine whether the inverted function Y of the NAND2 cell matches the function Y of the AND2 cell, a logic NOT is performed on the first $2^n$ bits of the NAND2 cell's signature. The TT for the NAND2 cell is {(X1, X2),7} and the logical NOT on the first $2^n=4$ bits of the signature produces {(X1, X2), 8}, which matches the TT for the AND2 cell. Since the logical NOT operation is a very fast operation, the TT representing the inverted function of the circuit TT is tested against the TTs for each library cell and the permutations of the cells' pins.

If a match is not found 218 at step 216, the circuit TT and the cell TT may match if one or more of the inputs to the cell TT (or circuit TT) is inverted. For example, consider again the TT representing the AND2 function:

TABLE 10

| X2 | X1 | Y |
|----|----|---|
| 0  | 0  | 0 |
| 0  | 1  | 0 |
| 1  | 0  | 0 |
| 1  | 1  | 1 |

If the input pin X2 is inverted, the following TT results:

TABLE 11

| X2 | X1 | Y |
|----|----|---|
| 0  | 0  | 0 |
| 0  | 1  | 1 |
| 1  | 0  | 0 |
| 1  | 1  | 0 |

From these two TTs, it is apparent that the Y bit of each row having the input pattern 0x, i.e., each row wherein X2 has a value of "0", has been swapped with the Y bit of each row having the input pattern 1x, i.e., each row wherein X2 has a value of "1".

This rule can be generalized on n bits as the following:
The inversion of a pin i in TT $\{(x_{n-1}, \ldots, x_1, \ldots x_0), S\}$ is the TT:

$\{(x_{n-1}, \ldots, x_1, \ldots x_0), S_{inv(i)}\}$ with $S_{inv(i)}[x_{n-1}, \ldots, x_{i+1} \mathbf{0}x_{i-1} \ldots x_0] = S[x_{n-1} \ldots x_{i+1} \mathbf{1}x_{i-1} \ldots x_0]$ and $S_{inv(i)}[x_{n-1} \ldots x_{i+1} \ldots x_0] = S[x_{n-1} \ldots x_{i+1} \mathbf{0}x_{i-1} \ldots x_0]$.

In other words, the bits of the signature can be swapped to emulate an inversion of an input pin. This swap of bits in the signature can be performed several times to effectively invert multiple pins of a function. Accordingly, the circuit TT and its inverse are tested 222 against the TTs corresponding to each permutation and inversion of the inputs to a cell.

For a 5-bit TT, there are 32 combinations of inverted inputs. Accordingly, the steps of calculating the inverted inputs and comparing the TTs can be quite computationally expensive. A preferred embodiment of the present invention reduces the number of TTs by eliminating those that are redundant. One embodiment of the present invention generates and compares all of the signature permutations representing the inversions of the input pins of the cells when the cell library 124 is loaded. Then, only the unique permutations are stored for later comparison. Depending on the processing power and memory available, the embodiment of the present invention may store all of the permutations for each cell or use selection criteria to determine which permutations of which cells should be retained for comparing with circuit TTs. Since the step of generating and testing permutations is performed only once when the cell library 124 is loaded, it is not computationally expensive.

If a match is found 224, then the combinatorial block can be replaced with the library cell or cells having the function of the matching TT. If a match is not found 224, then the cell library 124 does not contain a cell having the equivalent function of the combinatorial block 214.

In a typical embodiment, a Mapper traverses the abstract representation of the circuit design 120 and tiles each sub-tree with a matching cell or cells from the technology library 124. When attempting to match a sub-tree with a cell, the Mapper invokes the Boolean Matcher 120 and passes the Matcher 120 the sub-tree to be matched and the name of a cell in the technology library 124. The Matcher 120 attempts to match the sub-tree to the cell using the method described with respect to FIG. 2 and returns either a positive or negative response. If the response is positive, the Matcher 120 also describes the correspondence between the inputs of the sub-tree and the input pins of the cell. In one embodiment, the Mapper repeatedly invokes the Matcher 120 with different cells until a matching cell is found.

In one embodiment of the present invention, the Matcher 120 is described with the C++ programming language and has the following interface:

```
bool match(  const string& cellName,
             const TTMatchNodeCL& node,
             const TTMatchNodeListCL& nodePinList,
             TTMatchNodeListCL* matchNodePinList,   // return
             TTMatchPinListCL*& matchCellPinList,    // return
             bool& invertedOutput);                   // return
```

More specifically, the match method receives an input "cellName" that references the name of the cell in the technology library and an input "node" that refers to the starting, or root, node of the sub-tree against which the cell will be matched. In addition, the match method receives an input "nodePinList" that refers to a list of the input pins to the sub-tree.

If the circuit TT matches a cell TT, the match( ) method returns the value "true." In addition, the list of node pins (i.e., the input pins to the circuit represented by the sub-tree) is returned in matchNode)PinList and the list of cell pins is returned in matchCellPinList. Each list of pins also indicates the polarity of each pin and the pin's associated node. The matching pin correspondence can be determined by comparing the two pin list. Information about the polarity of the output, i.e., does the cell match the sub-tree or the inverted sub-tree, is returned in invertedOutput.

Figure 4A:
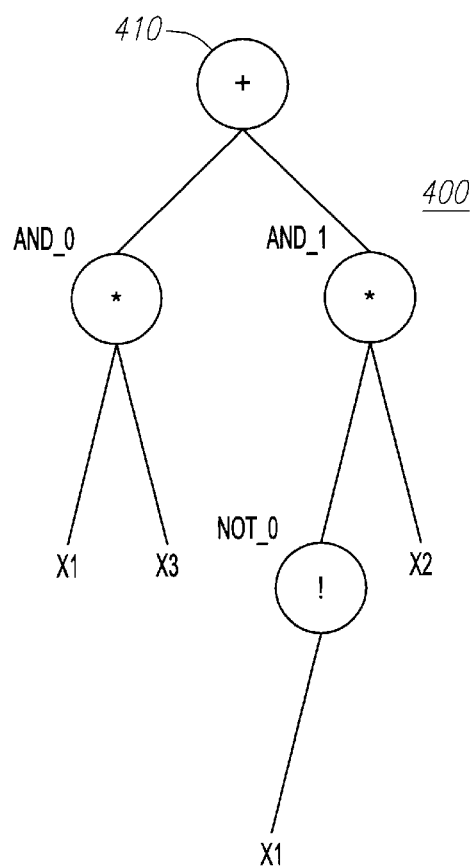
FIG. 4 illustrates an example of the match( ) method using a sub-tree and a cell.
Figure 4B:
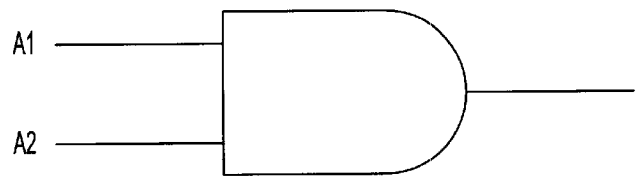

FIG. 4 illustrates an example of the match( ) method using a sub-tree and a cell. FIG. 4A illustrate the sub-tree 400 representing the function Y=(X1 AND X3) OR (NOT(X1 AND X2). FIG. 4B illustrates the AND2 cell having the function Z=A1 AND A2. The truth table for the sub tree 400 is illustrated in table 12.

TABLE 12

| X3 | X2 | X1 | Y |
|---|---|---|---|
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

Given the sub-tree 400 and using node 410 as the input node, the inputs to the match method are: cellName=AND2, node=node 410, and nodePinList=(X1, X2, X3). The match method indicates a match and returns: matchNodePinList= {AND_0 inverted, AND_1}, matchCellPinList={A1, A2}, and inverted output=TRUE. Accordingly, node 410 can be replaced with cell 450. The inputs to cell 450 are the inversions of AND_0 and AND_1.

In an alternative embodiment, the Mapper passes the sub-tree to the Matcher 120 but lets the Matcher 120 find the matching cell in the technology library 124. In this embodiment, the Match method has the following interface:

```
bool match(   const TTMatchNodeCL& node,
              const TTMatchNodeListCL& nodePinList,
              const string* cellname,              // return
              TTMatchPinListCL*& matchCellPinList, // return
              bool& invertedOutput);               // return
```

With this interface, the Matcher 120 preferably searches a fast-search data structure of cells, such as a hash table, to find the cell or cells having the same signature as the sub-tree node. If multiple matching cells are found, the Matcher 120 can either return the smallest matching cell or return a list of matching cells to the Mapper. In the latter case, the Mapper can decide which cell to select based on other characteristics of the circuit, such as the area or timing cost functions.

The latter embodiment where the Matcher 120 searches every possible cell for a match is likely to be more robust than the former embodiment where the Mapper only invokes the Matcher 120 with certain cells. For example, the Matcher 120 may find a match with a cell that the Mapper would not normally pass to the Matcher 120. In addition, the Mapper would not waste time parsing the list of cells or invoking the Matcher 120 with an obviously non-matching cell.

In, sum, the present invention is a method, system, and software module for determining whether a combinatorial block matches a cell in a technology library. The present invention uses truth tables to quickly and efficiently test for whether there is a match if input pins are inverted or permuted, or if the output is inverted.

I claim:

1. A method for determining whether a cell in a technology library matches a combinatorial block of a circuit design, the method comprising the steps of:

generating a representation of a first truth table representing a function of the cell having at least one input and a first signature;

generating a representation of a second truth table representing a function of the combinatorial block having at least one input and a second signature, wherein the representation of the second truth table is generated by combining two or more child truth tables, wherein each child truth table represents a function of a node of the combinatorial block; and comparing the representations of the first and second truth tables to determine whether the cell matches the combinatorial block.

2. The method of claim 1, wherein the step of generating the representation of the first truth table representing the function of the cell comprises the steps of:

parsing a string describing the functionality of the cell into a Boolean tree; and traversing the Boolean tree to generate the representation of the first truth table.

3. The method of claim 2, wherein the step of traversing the Boolean tree to generate the representation of the first truth table comprises the step of:

performing a depth-first traversal of the Boolean tree.

4. The method of claim 1, wherein the step of comparing the representations of the first and second truth tables to determine whether the cell matches the combinatorial block comprises the steps of:

determining whether the representations of the first and second truth tables have a same number of inputs; and determining whether the first signature matches the second signature.

5. The method of claim 1, wherein the step of comparing the representations of the first and second truth tables to determine whether the cell matches the combinatorial block comprises the steps of:

permuting an order of the at least one input of the representation of the first truth table to generate a new signature; and determining whether the second signature matches the new signature.

6. The method of claim 1, wherein the step of comparing the representations of the first and second truth tables to determine whether the cell matches the combinatorial block comprises the steps of:

inverting a signature selected from the first and second signatures to produce an inverted signature; and determining whether the inverted signature matches the signature that was not selected.

7. The method of claim 1, wherein the step of comparing the representations of the first and second truth tables to determine whether the cell matches the combinatorial block comprises the steps of:

generating a new signature representing an inversion of at least one input of the representation of the first truth table; and determining whether the second signature matches the new signature.

8. The method of claim 1, wherein the step of comparing the representations of the first and second truth tables to determine whether the cell matches the combinatorial block comprises the steps of:

generating a new signature representing an inversion of at least one input of the representation of the second truth table; and determining whether the first signature matches the new signature.

9. A computer program product having a computer-readable medium having computer program instructions encoded thereon for determining whether a first Boolean tree matches a second Boolean tree, the computer program instructions for performing the method steps of:

generating a representation of a first truth table having a set of first inputs and a first signature from the first Boolean tree;

generating a representation of a second truth table having a set of second inputs and a second signature from the second Boolean tree, wherein the representation of the second truth table is generated by combining two or more child truth tables on the same level of the Boolean tree, wherein each child truth table represents a function of a node of the Boolean tree.

producing an output indicating whether the first Boolean tree matches the second Boolean tree by analyzing the first and second signatures; and responsive to producing an output indicating that the first Boolean tree matches the second Boolean tree, producing an output indicating a matching correspondence between the set of first inputs and the set of second inputs.

10. The computer program product of claim 9, further comprising computer program instructions for performing the method step of:

responsive to producing an output indicating that the first Boolean tree matches the second Boolean tree, producing an output indicating whether the first Boolean tree matches an inversion of the second Boolean tree.

11. The computer program product of claim 9, wherein the first and second Boolean trees each comprise at least one node and the computer program instructions perform the method step of:

responsive to producing an output indicating that the first Boolean tree matches the second Boolean tree, producing an output indicating a correspondence between the at least one node of the first Boolean tree with the at least one node of the second Boolean tree.

12. The computer program product of claim 9, wherein the computer program instructions for performing the method steps of generating the representation of the first truth table the first Boolean tree perform the method steps of:

parsing a string representing a function of a cell in a technology library; and generating the first Boolean tree from the parsed string.

13. The computer program product of claim 9, further comprising computer instructions for performing the method step of:

representing each of the first and second truth tables with a first value representing the set of inputs to the truth table and a second value representing the signature of the truth table.

14. The computer program product of claim 9, wherein the method step of producing an output indicating whether the first Boolean tree matches the second Boolean tree comprises the steps of:

determining whether the first and second sets of inputs each contain a same number of inputs; and responsive to a determination that the first and second sets of inputs each contain the same number of inputs, determining whether the representations of the first and second truth tables have equivalent signatures.

15. The computer program product of claim 9, wherein the method step of producing an output indicating whether the first Boolean tree matches the second Boolean tree comprises the steps of:

permuting an order of the first set of inputs to generate at least one permuted first signature;

determining whether the permuted first signature matches the second signature.

16. The computer program product of claim 9, wherein the method step of producing an output indicating whether the first Boolean tree matches the second Boolean tree comprises the steps of:

generating a new first signature representing an inversion of at least one input in the first set of inputs; and determining whether the new first signature matches the second signature.

17. The computer program product of claim 9, wherein the method step of producing an output indicating whether the first Boolean tree matches the second Boolean tree comprises the steps of:

inverting the first signature to produce an inverted first signature; and determining whether the inverted first signature matches the second signature.

18. A computer system having a memory for determining whether a first circuit representation stored in the memory matches a second circuit representation stored in the memory, the computer system comprising:

a module for generating a representation of a first truth table having a set of first inputs and a first signature from the first circuit representation;

a module for generating a representation of a second truth table having a set of second inputs and a second signature from the second circuit representation, wherein the second circuit representation comprising two or mode nodes, and the representation of the second truth table is generated by combining truth tables corresponding to the two or more nodes; and a module for determining whether the representation of the first truth table matches the representation of the second truth table from the first and second sets of inputs and the first and second signatures.

19. The computer system of claim 18, further comprising:

a module for producing an output indicating a matching correspondence between the set of first inputs and the set of second inputs responsive to a determination that the representation of the first truth table matches the representation of the second truth table.

* * * * *